United States Patent
Daio et al.

(10) Patent No.: US 7,991,032 B2
(45) Date of Patent: Aug. 2, 2011

(54) LASER DRIVE

(75) Inventors: Katsuhisa Daio, Kagoshima (JP); Takahiro Tsukada, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/659,317

(22) Filed: Mar. 4, 2010

(65) Prior Publication Data

US 2010/0260219 A1  Oct. 14, 2010

(30) Foreign Application Priority Data

Apr. 13, 2009 (JP) ................................. 2009-097356

(51) Int. Cl.
*H01S 3/10* (2006.01)
(52) U.S. Cl. ............... 372/38.02; 372/38.01; 372/38.03; 372/38.07
(58) Field of Classification Search ............... 372/38.01, 372/38.02, 38.03, 38.07
See application file for complete search history.

(56) References Cited

U.S. PATENT DOCUMENTS

| 7,352,786 B2 * | 4/2008 | Ikeda ......................... 372/38.01 |
| 2006/0291512 A1 * | 12/2006 | Borschowa ................ 372/38.02 |
| 2009/0232174 A1 * | 9/2009 | Furukawa et al. ......... 372/38.02 |

FOREIGN PATENT DOCUMENTS

| JP | 2002-076504 A | 3/2002 |
| JP | 2008-098657 A | 4/2008 |
| JP | 2008-113050 A | 5/2008 |
| JP | 2008-113051 A | 5/2008 |

* cited by examiner

*Primary Examiner* — Minsun Harvey
*Assistant Examiner* — Michael Carter
(74) *Attorney, Agent, or Firm* — Rader, Fishman & Grauer PLLC (57) ABSTRACT

Disclosed herein is a laser driver including a light emission controlling section configured to stop generation of a control voltage by a control voltage generating section, causing a given voltage corresponding to a magnitude of a reference current to be outputted to an input node of a first emitter follower to operate the first emitter follower for a first time period from start of a light emission time period, release stop of the generation of the control voltage by the control voltage generating section, causing the control voltage to be outputted to the input node of the first emitter follower to operate the first emitter follower until end of the light emission time period of the laser, and operate a second emitter follower to discharge electric charges accumulated in the laser for a second time period after the end of the light emission time period of the laser.

6 Claims, 7 Drawing Sheets

FIG. 7B CURRENT SOURCE 100

FIG. 7C CURRENT 111

FIG. 7D CURRENT $I_R$

FIG. 7E CURRENT $I_R$

LASER DRIVE

BACKGROUND OF THE INVENTION

1. Field of the Invention

The present invention relates to a laser driver for causing a laser to emit a laser beam, and more particularly to a laser driver for driving a vertical cavity surface emitting laser.

2. Description of the Related Art

A light emission resistance of a vertical cavity surface emitting laser is about one order of magnitude larger than that of an edge emitting laser and has a resistance value of about 100 Ω. In addition thereto, a parasitic capacitance of the vertical cavity surface emitting laser becomes large along with increased multiple channel. Moreover, the light emission resistance of the vertical cavity surface emitting laser changes due to a change in temperature following the light emission, and thus light emission characteristics also change.

In order to cope with such a situation, for the drive for the vertical cavity surface emitting laser, the light emission characteristics are stabilized by not using a voltage driving system with which the change in light emission resistance is influenced, but using a current driving system in many cases.

However, in the vertical cavity surface emitting laser, rising characteristics (TR characteristics) and fall characteristics (TF characteristics) which are not influenced so much in the case of the edge emitting laser depend on a time constant determined based on a resistance value of the light emission resistance, and a capacitance value of a parasitic capacitance parasitic in the vertical cavity surface emitting laser. To this end, the current driving system involves such a problem that a waveform of a drive signal for driving the vertical cavity surface emitting laser is driven is blunted in shape.

Figure 6A:
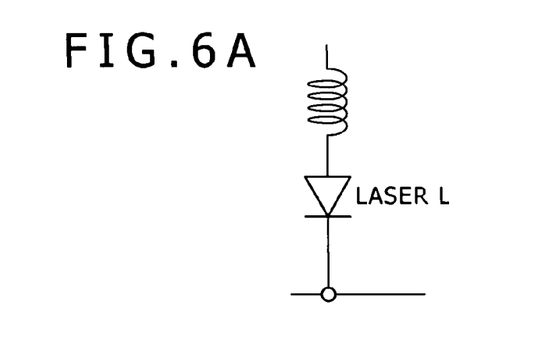
FIGS. 6A and 6B are a circuit diagram and an equivalent circuit diagram of an existing laser, respectively.
Figure 6B:
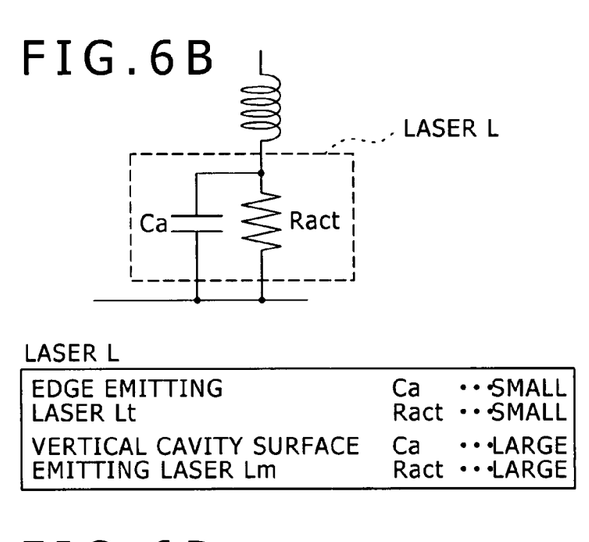
Figure 6C:
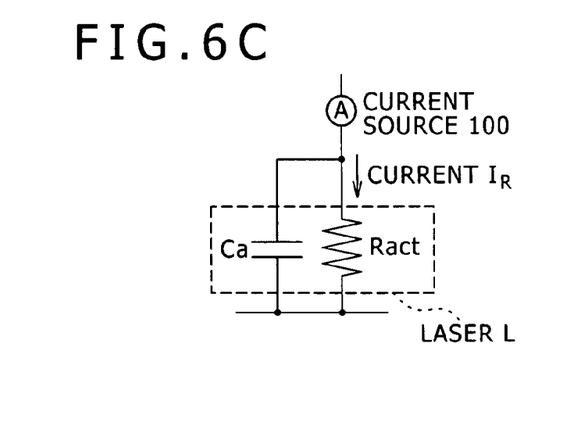
FIGS. 6C and 6D are the equivalent circuit and waveform charts explaining an operation for driving the existing laser, respectively.

This problem will now be concretely described with reference to FIGS. 6A to 6D. FIG. 6B shows an equivalent circuit diagram of a laser L shown in FIG. 6A. Each of an edge emitting laser Lt and a vertical cavity surface emitting laser Lm is equivalently expressed in the form of a parallel circuit of a light emission resistance Ract and a parasitic capacitance Ca.

The edge emitting laser Lt has the small light emission resistance Ract and the small parasitic capacitance Ca. For example, a resistance value of the light emission resistance Ract is about several tens of Ω. On the other hand, the resistance value of the light emission resistance Ract of the vertical cavity surface emitting laser Lm is about one order of magnitude than that of the edge emitting laser Lt. In addition thereto, since a large number of vertical cavity surface emitting lasers Lm are formed on one plane, each of lengths of distributed electrodes becomes long, which results in that a capacitance is readily formed between each two adjacent electrodes.

As has been described, an area of a light-emitting face of the vertical cavity surface emitting laser Lm is larger than that of the edge emitting laser Lt, which results in that the light emission resistance Ract and parasitic capacitance Ca of the vertical cavity surface emitting laser Lm are each larger than those of the edge emitting laser Lt.

Figure 6D:
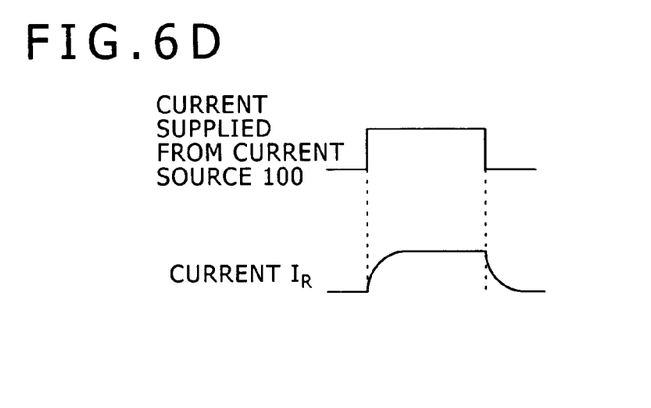

Here, FIG. 6D shows a waveform chart of a current $I_R$ which is caused to flow through the vertical cavity surface emitting laser Lm when the current $I_R$ is supplied from a current source 100 to the vertical cavity surface emitting laser Lm.

When the supply of the current $I_R$ from the current source 100 is started, almost the current $I_R$ supplied from the current source 100 is caused to flow through the parasitic capacitance Ca. Also, as the parasitic capacitance Ca is charged with the electric charges originating from the supplied current, the current supplied to the parasitic capacitance Ca is gradually reduced, and thus the current $I_R$ supplied to the light emission resistance Ract gradually increases. When the charging of the parasitic capacitance Ca with the electric charges is completed, all the current $I_R$ supplied from the current source 100 is caused to flow through the light emission resistance Ract. On the other hand, as soon as the current supply from the current source 100 is stopped, the current $I_R$ starts to be supplied from the parasitic capacitance Ca in which the electric charges are accumulated based on the charging to the light emission resistance Ract.

As a result, the waveform of the current $I_R$ supplied from the current source 100 to the vertical cavity surface emitting laser Lm is blunted at the time of the rising thereof, as well as at the time of the fall thereof in accordance with a time constant CaRact. This means that a modulation speed when a laser beam is modulated becomes slow.

In order to cope with this problem, in the related art, the rising and fall characteristics (hereinafter referred to as "the TR/TF characteristics") of the vertical cavity surface emitting laser are improved by providing a differential current generating circuit.

Figure 7A:
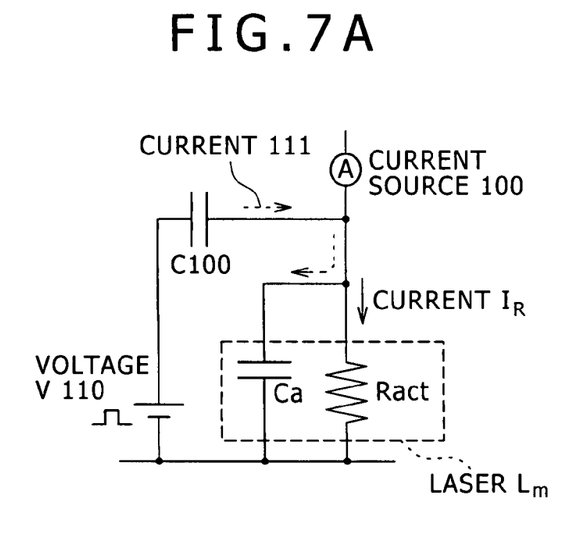
FIG. 7A, and FIGS. 7B to 7E are an equivalent circuit diagram explaining a concept of another existing laser driver, and waveform charts of a current pulse, a differential current and currents in the operation for driving the existing laser driver shown in FIG. 7A, respectively.
Figures 7B, 7C:
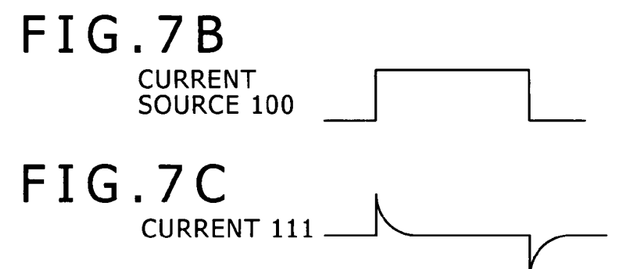
Figure 7D:
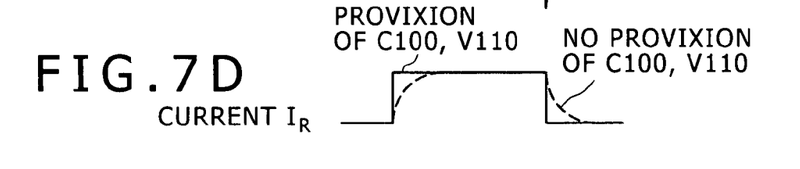
Figure 7E:
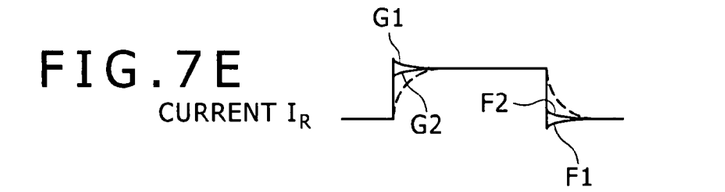

FIG. 7A is a circuit diagram explaining a concept of an improvement in the TR/TF characteristics by providing a differential current generating circuit. In addition, FIG. 7B is a waveform chart of a current pulse supplied from a current source 110, and FIG. 7C is a waveform chart of a differential current. Also, FIGS. 7D and 7E are waveform charts of currents each supplied to the vertical cavity surface emitting laser.

A rectangular current pulse is supplied from the current source 110 to the vertical cavity surface emitting laser Lm to drive the vertical cavity surface emitting laser Lm (refer to FIG. 7B). On the other hand, a voltage V110 rises synchronously with the rising of the rectangular current pulse supplied from the current source 110 to supply a positive current differentiated through a capacitor C100 to the vertical cavity surface emitting laser Lm (refer to FIG. 7C). In the manner described above, the rising characteristics of the vertical cavity surface emitting laser Lm are improved (refer to FIG. 7D). In addition, the voltage V110 falls synchronously with the fall of the current pulse supplied from the current source 110 to supply a negative current differentiated through the capacitor C100 to the vertical cavity surface emitting laser Lm (refer to FIG. 7C). In the manner described above, the fall characteristics of the vertical cavity surface emitting laser Lm are improved (refer to FIG. 7D).

For example, with the techniques disclosed in Japanese Patent Laid-Open Nos. 2002-76504, 2008-113050 and 2008-113051, respectively, a complementary current source is provided in a drive source for a vertical cavity surface emitting laser, and a differential current is supplied from the complementary current source to the vertical cavity surface emitting laser, thereby improving the TR/TF characteristics of the vertical cavity surface emitting laser. In addition, it is proposed that a control voltage for the complementary current source is sampled and held, thereby controlling a voltage developed across both ends for application of the differential current, a complementary waveform is compared with a reference, thereby adjusting an amount of compensation, and a compensation capacitance is switched over to another one every vertical cavity surface emitting laser having multiple channels, thereby carrying out the driving operation.

In addition, a driving method of driving a vertical cavity surface emitting laser by switching a voltage driving driver, and a current driving driver over to each other is proposed in Japanese Patent Laid-Open No. 2008-98657 (refer to FIG. 15). The vertical cavity surface emitting laser emits a laser beam, so that a temperature of the vertical cavity surface emitting laser rises. A rise of the temperature of the vertical cavity surface emitting laser results in that a light emission resistance changes and thus an amount of light emission fluctuates. In order to prevent this situation from being caused, with the technique disclosed in Japanese Patent Laid-Open No. 2008-98657, after the vertical cavity surface emitting laser is driven for a given time period in accordance with the voltage drive, the voltage drive is switched over to current drive, thereby maintaining the amount of light emission.

SUMMARY OF THE INVENTION

However, even when the rising and fall characteristics of the vertical cavity surface emitting laser are improved by applying the differential current as shown in FIG. 7C to the vertical cavity surface emitting laser, the capacitance value of the capacitor C100 for application of the differential current, and the capacitance value of the parasitic capacitance Ca disperse, or the resistance value of the light emission resistance Ract disperses. As a result, over-compensation is caused as shown in a current G1 or a current F1 of FIG. 7E, or insufficient compensation is caused as shown in a current G2 or a current F2 of FIG. 7E. In order to prevent the over-compensation or insufficient compensation thus caused, there are taken such measures that an output voltage at a drive stabilization point is sampled and held, thereby controlling the magnitude of the voltage V100, a compensation waveform is compared with a reference waveform, thereby adjusting an amount of compensation, or the capacitor C100 for application of the differential current is switched over to another one. However, all those measures are such that the amount of compensation for the differential current is controlled in the current drive. As a result, there is encountered such a problem that the control becomes complicated, and thus the circuit scale becomes large.

In addition, when the drive is carried out by switching the drivers complying with the two systems of the voltage driving system and the current driving system over to each other, it is necessary to provide both the voltage driving driver, and the current driving driver. As a result, the circuit scale is compelled to become large, and thus those different control systems need to be smoothly switched over to each other, so that the control is compelled to become complicated. In addition, unless an initial current for the current drive, an initial voltage for the voltage drive, and a drive current for the light emission resistance Ract need to be justified with high accuracy, a difference in level on the switching or the like is caused. As a result, the advanced timing processing is necessary for justifying the change in light emission resistance Ract and the channel dispersion.

In addition, when the vertical cavity surface emitting laser is driven by an output stage composed of only an emitter follower, it is possible to improve the blunting of the characteristics at the time of start of the light emission. However, with the output stage composed of only the emitter follower, it may be difficult to solve the problems about the change in amount of light emission following the change in light emission resistance Ract, the nonuniformity of the amount of light emission due to the dispersion of the light emission resistance Ract between the channels, and the blunting of the OFF-characteristics of the light emission at the time of turn-OFF of the vertical cavity surface light emitting laser.

The present invention has been made in order to solve the problems described above, and it is therefore desirable to provide a laser driver with which rising and fall characteristics of a vertical cavity surface emitting laser can be improved without complicating a circuit configuration.

In order to attain the desire described above, according to an embodiment of the present invention, there is provided a laser driver including: a driving section having a first emitter follower for supplying a drive current to a laser, and a second emitter follower for discharging electric charges accumulated in the laser; a drive current detecting section configured to detect a magnitude of the drive current; a reference current detecting section configured to receive as its input a reference current as a reference for the drive current, and detect a magnitude of the reference current; a control voltage generating section configured to compare a detection result obtained in the drive current detecting section and a detection result obtained in the reference current detecting section with each other, and generate a control voltage corresponding to the comparison result; and a light emission controlling section configured to stop the generation of the control voltage by the control voltage generating section and cause a given voltage corresponding to the magnitude of the reference current to be outputted to an input node of the first emitter follower to operate the first emitter follower for a first time period from start of a light emission time period of the laser, release the stop of the generation of the control voltage by the control voltage generating section and cause the control voltage thus generated to be outputted to the input node of the first emitter follower to operate the first emitter follower until end of the light emission time period of the laser, and operate the second emitter follower to discharge electric charges accumulated in the laser for a second time period after the end of the light emission time period of the laser.

As set forth hereinabove, according to an embodiment of the present invention, since the drive current is supplied to the laser in accordance with the voltage drive for the first time period from the start of the light emission time period of the laser, it is possible to realize the high-speed rising characteristics (TR characteristics) without being influenced by the parasitic capacitance parasitic in the laser. In addition, since the laser driver has the feedback loop for monitoring the drive current in real time during the voltage drive until the end of the subsequent light emission time period, and making feedback to the drive voltage, the drive current can be held constant irrespective of the fluctuation of the light emission resistance. Moreover, the second emitter follower is operated to discharge the electric charges accumulated in the laser for the second time period after the end of the light emission time period of the laser, the electric charge drawing characteristics are enhanced, and thus it is possible to realize the high-speed fall characteristics (TF characteristics).

DETAILED DESCRIPTION OF THE PREFERRED EMBODIMENTS

Hereinafter, an embodiment of the present invention will be described in detail with reference to the accompanying drawings. It is noted that the description will now be given in accordance with the following order.

1. Basic Configuration of Laser Driver
2. Concrete Circuit Configuration of Laser Driver 1. Basic Configuration of Laser Driver Firstly, a basic configuration of a laser driver according to an embodiment of the present invention will be described in detail with reference to FIG. 1, and FIGS. 2A and 2B.

Figure 1:
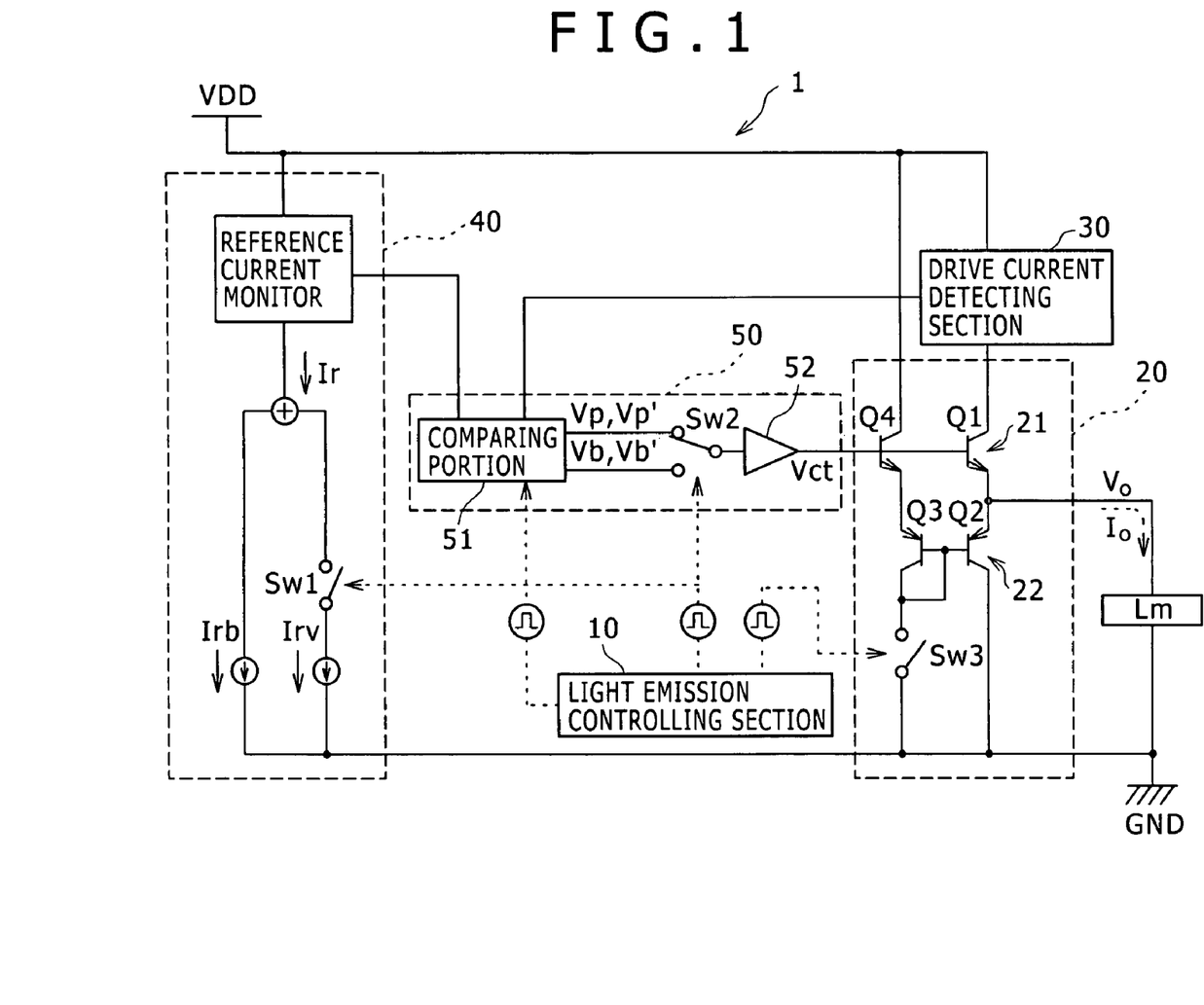
FIG. 1 is a circuit diagram, partly in block, showing a basic configuration of a laser driver according to an embodiment of the present invention.

As shown in FIG. 1, the laser driver 1 according to the embodiment of the present invention includes a light emission controlling section 10, a driving section 20, a drive current detecting section 30, a reference current detecting section 40, and a control voltage generating section 50. Also, with the configuration shown in FIG. 1, the laser driver 1 supplies a drive current $I_0$ to a vertical cavity surface emitting laser Lm.

1.1. Configurations of Sections

Figure 2A:
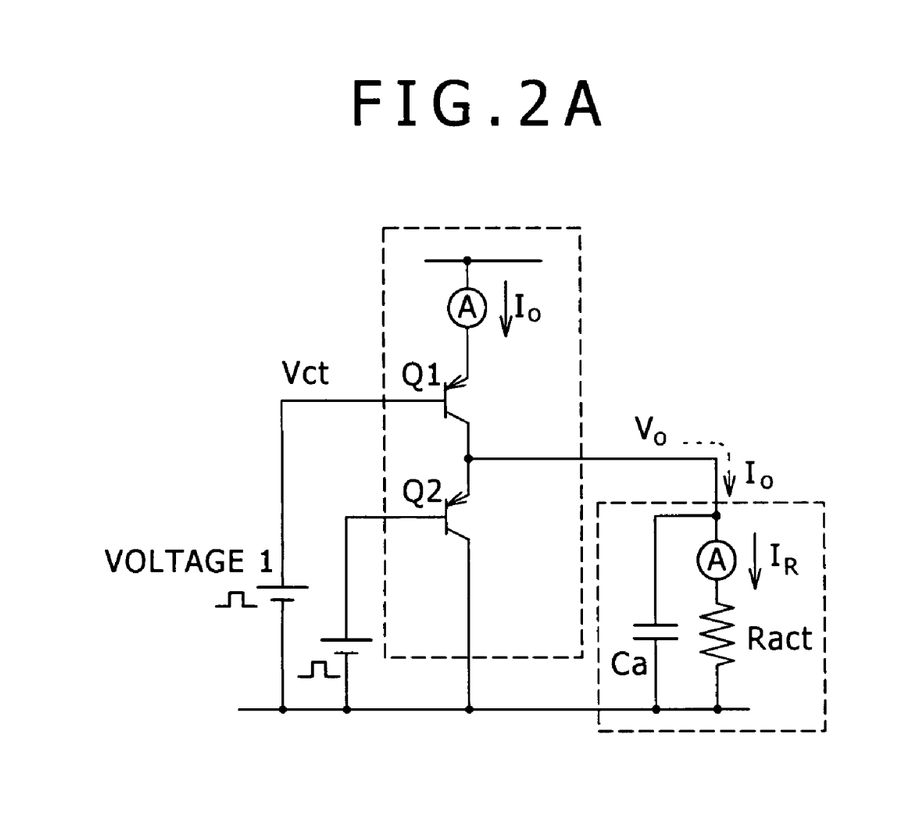
FIGS. 2A and 2B are respectively an equivalent circuit diagram of the laser driver according to the embodiment of the present invention, and a timing chart explaining an operation of the laser driver according to the embodiment of the present invention.

The light emission controlling section 10 controls the driving section 20, the reference current detecting section 40 and the control voltage generating section 50, thereby supplying the drive current $I_0$ from the driving section 20 to the vertical cavity surface emitting laser Lm (hereinafter referred simply to as "the laser Lm"). It is noted that as shown in FIG. 2A, the laser Lm is equivalently expressed in the form of a parallel circuit of a light emission resistance Ract and a parasitic capacitance Ca.

The driving section 20 has a first emitter follower 21 supplies the drive current $I_0$ to the laser Lm and a second emitter follower 22 discharges electric charges accumulated in the parasitic capacitance Ca of the laser Lm.

A light emission current $I_0p$, a bias current $I_0b$ and the like are given as the drive current $I_0$ which is supplied to the laser Lm in terms of kinds. "The light emission current $I_0p$" is a current which is necessary for emitting a laser beam from the laser Lm and thus a current having a current value corresponding to an intensity of the laser beam which is attempted to be emitted from the laser Lm. In addition, "the bias current $I_0b$" is a current which is supplied to the laser Lm when no light emission control is carried out, and thus a current which is supplied to the laser Lm in order to suppress a light emission delay of the laser Lm. The bias current $I_0b$ is the current having a current value smaller than that of the current used to emit the laser beam from the laser Lm.

The first emitter follower 21 is composed of an NPN type transistor Q1 (hereinafter referred to as "a first transistor Q1"), and the second emitter follower 22 is composed of a PNP transistor Q2 (hereinafter referred to as "a second transistor Q2"). An emitter of the first transistor Q1 and an emitter of the second transistor Q2 are connected to each other.

In addition, the driving section 20 includes an NPN type transistor Q3 (hereinafter referred to as "a third transistor Q3") and a PNP type transistor Q4 (hereinafter referred to as "a fourth transistor Q4"). In this case, the third transistor Q3 composes a current mirror circuit together with the second transistor Q2. In addition, an emitter of the third transistor Q3 and an emitter of the fourth transistor Q4 are connected to each other. Also, a control voltage Vct is inputted to a base of the fourth transistor Q4.

Moreover, a switch Sw3 is provided between a collector of the third transistor Q3 and the ground GND. When the switch Sw3 is turned ON, the collector of the third transistor Q3 is connected to the ground GND. As a result, the second transistor Q2 is turned OFF, and thus the electric charges accumulated in the parasitic capacitance Ca of the laser Lm are discharged because the second transistor Q2 serves as the second emitter follower 22.

The drive current detecting section 30 detects a magnitude of the drive current $I_0$ which is supplied to the laser Lm by the driving section 20, and outputs information on the magnitude of the drive current $I_0$ thus detected to the control voltage generating section 50.

The reference current detecting section 40 detects a magnitude of a reference current Ir as a reference for the drive current $I_0$, and outputs information on the magnitude of the reference current Ir thus detected to the control voltage generating section 50. It is noted that a bias reference current $I_0br$ as a reference for the bias current $I_0b$, and a light emission reference current $I_0pr$ as a reference for the light emission current $I_0p$ are given as the reference current Ir. The light emission reference current $I_0pr$ has a value which is obtained by adding a control current Irv which changes in accordance with the light emission intensity to the bias reference current $I_0br$. Although the bias reference current $I_0br$ and the control current Irv are inputted from an external signal processing portion (not shown), the bias reference current $I_0br$ may be generated within the reference current detecting section 40. It is noted that automatic power control (APC) is carried out for the control current Irv so that in the external signal processing portion, a reflected wave from an object for radiation of a laser beam from the laser Lm is detected, and the laser beam having a suitable intensity is radiated to the object for the radiation.

In the control voltage generating section 50, a comparing portion 51 compares the magnitude of the drive current $I_0$ with the magnitude of the reference current Ir and outputs a voltage corresponding to the comparison result. The voltage outputted from the comparing portion 51 is inputted to an amplifying portion 52, is amplified by the amplifying portion 52, and is then outputted as the control voltage Vct to the driving section 20.

A voltage Vb corresponding to a difference between the magnitude of the drive current $I_0$ and the magnitude of the bias reference current $I_0br$, and a voltage Vp corresponding to a difference between the magnitude of the drive current $I_0$ and the magnitude of the light emission reference current $I_0pr$ are given as the voltages outputted from the comparing portion 51. The control voltage generating section 50 has a switch Sw2, and the selectively outputs the voltages Vb and Vp each outputted from the comparing portion 51 to the amplifying portion 52.

Here, "the magnitude of the drive current $I_0$" and "the magnitude of the bias reference current $I_0br$" mean the relative magnitudes, respectively. In this embodiment, it is regulated that when the current value of the drive current $I_0$ becomes n times (n>1) as large as that of the reference current Ir, the magnitude of the drive current $I_0$, and the magnitude of the reference current Ir are equal to each other. Therefore, the comparing portion 51 compares the current value which is obtained by multiplying the current value of the reference current Ir by n, and the current value of the drive current $I_0$ with each other. In the following description, as an example, the drive current detecting section 30 and the reference current detecting section 40 output the voltage corresponding to the current value of the drive current $I_0$, and the voltage corresponding to the current value of the reference current Ir in the form of the magnitudes of the currents, respectively. Also, a ratio of the current-voltage conversion rate in the reference current detecting section 40 to the current-voltage conversion rate in the drive current detecting section 30 is set as 1:n (n≧1).

In addition, in response to a request made from the light emission controlling section 10, the control voltage generating section 50 stops the generation of the voltage Vb corresponding to the difference between the magnitude of the drive current $I_0$ and the magnitude of the bias reference current $I_0$br, and holds therein the voltage Vb. Also, the control voltage generating section 50 stops the generation of the voltage Vp corresponding to the difference between the magnitude of the drive current $I_0$ and the light emission reference current $I_0$pr, and holds therein the voltage Vp. In the following description, the voltages Vb and Vp thus held are referred to as the held voltages Vb' and Vp', respectively.

The laser driver 1 configured in the manner described above can successively carry out first processing A to fourth processing D which will be described below. By successively carrying out the first processing A to the fourth processing D, high-speed rising characteristics (hereinafter referred to as "TR characteristics") and fall characteristics (hereinafter referred to as "TF characteristics") of the drive voltage $V_0$ are realized while the drive current $I_0$ is stably supplied.

First Processing A: Processing for Supplying Bias Current to Laser Lm

Second Processing B: Processing in Phase of Start of Drive for Laser Lm

Third Processing C: Processing for Supplying Light Emission Current to Laser Lm

Fourth Processing D: Processing in Phase of End of Drive for Laser Lm 1.2. First Processing A Firstly, processing for supplying the bias current to the laser Lm as the first processing A will be described below.

In the first processing A, the drive current $I_0$ is adjusted in accordance with the result of the comparison between the drive current $I_0$ and the bias reference current $I_0$br in the manner as will be described below, thereby stably supplying the bias current $I_0$b having the desired current value as the drive current $I_0$.

Firstly, the light emission controlling section 10 controls the switch Sw1 provided in the reference current detecting section 40 so as to select only the bias reference current $I_0$br as the reference current Ir which the reference current detecting section is caused to detect. In addition, the light emission controlling section 10 controls the switch Sw2 provided in the control voltage generating section 50 so as to input the voltage Vb outputted from the comparing section 51 to the amplifying portion 52.

The reference current detecting section 40 detects the magnitude of the bias reference current $I_0$br as the reference current Ir, and informs the control voltage generating section 50 of the magnitude of the bias reference current $I_0$br thus detected. On the other hand, the drive current detecting section 30 detects the magnitude of the drive current $I_0$, and informs the control voltage generating section 50 of the magnitude of the drive current $I_0$ thus detected.

In the control voltage generating section 50, the comparing portion 51 compares the magnitude of the drive current $I_0$ with the magnitude of the bias reference current $I_0$br, and outputs the voltage Vb corresponding to a difference between the drive current $I_0$ and the bias reference current $I_0$br. The voltage Vb outputted from the comparing portion 51 is inputted to the amplifying portion 52, amplified in the amplifying portion 52, and then inputted as a control voltage Vct1 to an input node of the first emitter follower 21 (a base of the first transistor Q1) provided in the driving section 20.

The voltage at an output node of the first emitter follower 21 becomes a voltage (hereinafter referred to as "a bias voltage V1") corresponding to the control voltage Vct1 inputted to the input node of the first emitter follower 21, so that the drive current $I_0$ is caused to flow through the laser Lm. At this time, since the drive current detecting section 30 detects the magnitude of the drive current $I_0$ and informs the control voltage generating section 50 of the magnitude of the drive current $I_0$ thus detected, the drive current $I_0$ finally becomes a bias current $I_0$b corresponding to the magnitude of the bias reference current $I_0$br.

A feedback loop for monitoring the drive current $I_0$ in real time, comparing the drive current $I_0$ with the bias current $I_0$br detected by the reference current detecting section 40, and feeding the comparison result as the control voltage Vct back to the driving section 20 for carrying out the voltage drive is formed in the laser driver 1 in the manner described above. For this reason, the first emitter follower 21 in the driving section 20 is controlled in accordance with the control voltage Vct inputted to the driving section 20 so that the magnitude of the drive current $I_0$ and the magnitude of the bias reference current $I_0$br becomes equal to each other (that is, the current value obtained by multiplying the current value of the reference current Ir by n, and the current value of the drive current $I_0$ become equal to each other). As a result, the bias current $I_0$b corresponding to the magnitude of the bias reference current $I_0$br is stably supplied from the first emitter follower 21 to the laser Lm.

As has been described, in the first processing A, the driving section 20 stably supplies the bias current $I_0$b to the laser Lm, and thus reduces the change in laser light emission response characteristics due to the change in bias current through the feedback loop for carrying out the feedback to the voltage drive.

1.3. Second Processing B

Next, the processing in the phase of start of drive for the laser Lm as the second processing B will be described below.

When the drive for the laser Lm is started, the bias current $I_0$b is supplied to the laser Lm in the first processing A. Thus, the electric charges exceeding in amount the electric charges corresponding to the bias voltage V1 are not accumulated in the parasitic capacitance Ca of the laser Lm. For this reason, when the light emission current $I_0$p based on the light emission reference current $I_0$pr is supplied as the drive current $I_0$ to the laser Lm as with the third processing C which will be described later, the TR characteristics becomes worse because it may be difficult to quickly charge the parasitic capacitance Ca of the laser Lm with the electric charges.

In order to cope with this situation, in the second processing B, the regular control voltage Vct outputted from the control voltage generating section 50 is kept without-forming the feedback loop corresponding to the change in drive current $I_0$ to carry out the voltage drive for the driving section 20, thereby applying a light emission voltage (hereinafter referred to as "a light emission voltage V2") to the laser Lm. Specifically, the following processing is carried out.

Firstly, the light emission controlling section 10 controls the switch Sw2 provided in the control voltage generating section 50 so as to input the held voltage Vp' outputted from the comparing section. 51 to the amplifying section 52. The held voltage Vp' is a voltage corresponding to the result of the last comparison (the result of the comparison between the light emission current $I_0p$ and the light emission reference current $I_0pr$) obtained from the comparing portion 51, and thus a voltage held in the comparing portion 51.

When the held voltage Vp' is inputted from the comparing portion 51, the amplifying portion 52 outputs a control voltage Vct2 corresponding to the held voltage Vp' thus inputted thereto. As a result, the given control voltage Vct2 is inputted to the base of the first transistor Q1, and thus the light emission voltage V2 is applied as the drive voltage $V_0$ to the laser Lm connected to the emitter of the first transistor Q1, thereby voltage-driving the laser Lm. That is to say, the driving section 20 functions as a non-feedback type voltage drive which stops the base voltage control loop of the first emitter follower 21, and does not monitor the drive current $I_0$. To this end, the parasitic capacitance Ca is quickly charged with the electric charges, and the light emission current $I_0p$ necessary for emission of the laser beam having a predetermined intensity is supplied to the light emission resistance Ract from the time of start of the supply of the light emission current $I_0p$. It is noted that at this time, a value of an output resistance (not shown) of the first emitter follower 21 is expressed by $R_0$, the parasitic capacitance Ca is charged with the electric charges in accordance with a time constant $R_0Ca$.

It is noted that along with the processing start of the second processing B, the light emission controlling section 10 controls the control voltage generating section 50 in such a way that the operation for comparing the magnitude of the drive current $I_0$ with the magnitude of the bias reference current $I_0br$ is stopped, and the voltage Vb corresponding to the comparison result right before the stop of that operation is held as a held voltage Vb' in the control voltage generating section 50. The held voltage Vb' is used in the fourth processing D which will be described later.

Figure 2B:
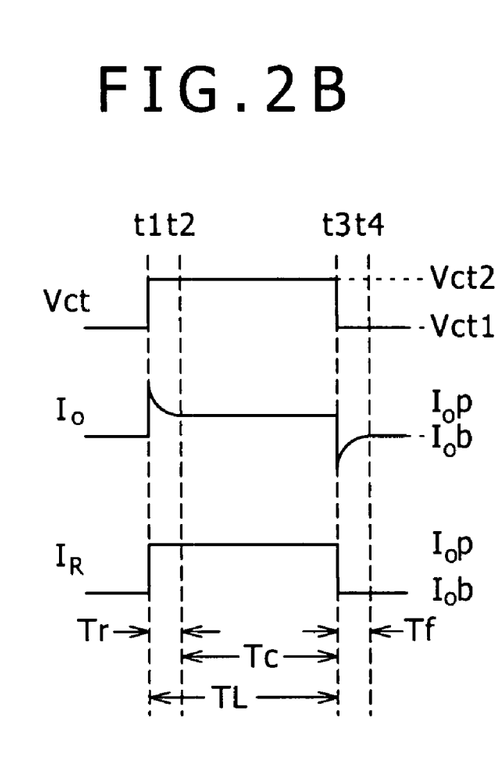

FIG. 2B shows a state of the control voltage Vct, the drive current $I_0$, and a current Ic caused to flow through the light emission resistance Ract at this time. As shown in FIG. 2B, for a time period for timings t1 to t2 as the time of start of the supply of the light emission current $I_0p$, a control voltage Vct2 corresponding to the held voltage Vp' is inputted to the base of the first transistor Q1. At this time, the light emission voltage V2 is applied as the drive voltage $V_0$ to the laser Lm. As a result, a current larger than the light emission current $I_0p$ is transiently caused to flow through the laser Lm, thereby quickly charging the parasitic capacitance Ca of the laser Lm with the electric charges. On the other hand, the light emission current $I_0p$ is supplied to the light emission resistance Ract of the laser Lm.

As has been described, in the laser driver 1, the second processing B is carried out for the predetermined time period Tr (for the timings t1 to t2) in the phase of start of the drive for the laser Lm, whereby the high-speed TR characteristics are realized without being influenced by the parasitic capacitor Ca and the like of the laser Lm.

In addition, in the second processing B, the control voltage generating section 50 holds therein the held voltage Vp' corresponding to the result of the last comparison between the light emission current $I_0p$ and the light emission reference current $I_0pr$. Thus, the control voltage generating section 50 generates the control voltage Vct2 in accordance with the held voltage Vp' held therein. Therefore, it is possible to apply the suitable light emission voltage V2 corresponding to the laser Lm because the difference with the control voltage Vct2 corresponding to the voltage Vp generated in the control voltage generating section 50 in the third processing C which will be subsequently carried out can be reduced or no difference therewith is caused.

It is noted that the predetermined time period Tr is preferably a time period for which the voltage developed across opposite ends of the parasitic capacitance Ca becomes about the light emission voltage V2 through the changing in the seconding processing B. As a result, when the processing proceeds from the second processing B to the third processing C which will be described later, the change in light emission current $I_0p$ can be suppressed, and thus the light emission intensity of the laser beam emitted from the laser Lm can be held approximately constant.

1.4. Third Processing C

Next, the processing for supplying the light emission current to the laser Lm as the third processing C will be described.

The third processing C is started at the timing t2 after a lapse of the predetermined time period Tr after start of the second processing B.

Firstly, a light emission controlling section 10 controls the switch Sw1 provided in the reference current detecting section 40 so as to select the light emission reference current $I_0pr$ as the reference current Ir which the reference current detecting section 40 is caused to detect.

The reference current detecting section 40 detects the magnitude of the light emission reference current $I_0pr$, and informs the control voltage generating section 50 of the magnitude of the light emission reference current $I_0pr$ thus detected. On the other hand, the drive current detecting section 30 detects the magnitude of the drive current $I_0$, and informs the control voltage generating section 50 of the magnitude of the drive current $I_0$ thus detected.

The light emission controlling section 10 controls the control voltage generating section 50 in such a way that the comparing portion 51 starts the operation for comparing the magnitude of the light emission current $I_0p$ with the magnitude of the light emission reference current $I_0pr$, and outputs the voltage Vp as the comparison result to the light emission controlling section 10. In addition, the light emission controlling section 10 maintains the state of the switch Sw2 as it is, and inputs the voltage Vp which is outputted from the comparing portion 51 to the amplifying portion 52. As a result, the voltage Vp corresponding to the difference between the magnitude of the drive current $I_0$ and the magnitude of the light emission reference current $I_0pr$ is amplified in the amplifying portion 52, and is then inputted as the control voltage Vct2 to the input node (the base of the first transistor Q1) of the first emitter follower 21 in the driving section 20.

The voltage at the output node of the first emitter follower 21 becomes the voltage corresponding to the control voltage Vct2 which is inputted to the input node of the first emitter follower 21, and thus the drive current $I_0$ is caused to flow through the laser Lm. At this time, the drive current detecting section 30 detects the magnitude of the drive current $I_0$ and informs the control voltage generating section 50 of the magnitude of the drive current $I_0$ thus detected. Therefore, the drive current $I_0$ finally becomes the light emission current $I_0p$ corresponding to the magnitude of the light emission reference current $I_0pr$.

FIG. 2B shows a state of the control voltage Vct, the drive current $I_0$, and a current $I_R$ caused to flow through the light emission resistance Ract at this time. As shown in FIG. 2B, the control voltage Vct2 corresponding to the drive current $I_0$ is inputted to the base of the first transistor Q1 at the timing t2 at which the predetermined time period Tr has passed from the start of the second processing B. To this end, the light emission current $I_0p$ corresponding to the magnitude of the light emission reference current $I_0pr$ is caused to flow through the laser Lm, and thus the light emission current $I_0p$ is continuously supplied to the light emission resistance Ract of the laser Lm.

As has been described, in the third processing C, the feedback loop for monitoring the drive current $I_0$ in real time, comparing the drive current $I_0$ with the light emission reference current $I_0pr$ detected by the reference current detecting section 40, and feeding the comparison result back to the driving section 20 for carrying out the voltage driving is formed in the laser driver 1. For this reason, the first emitter follower 21 in the driving section 20 is controlled in accordance with the control voltage Vct inputted to the driving section 20 so that the magnitude of the drive current $I_0$, and the magnitude of the light emission reference current $I_0pr$ become equal to each other (that is, the current value obtained by multiplying the current value of the reference current $I_0$ by n, and the current value of the drive current $I_0$ become equal to each other). As a result, the light emission current $I_0p$ corresponding to the magnitude of the light emission reference current $I_0pr$ is stably supplied from the first emitter follower 21 to the laser Lm.

Therefore, even in the case where the temperature change is caused in the light emission resistance Ract of the laser Lm while the laser Lm is caused to emit the laser beam, the drive current $I_0$ can be supplied to the laser Lm without depending on the light emission resistance Ract of the laser Lm, and thus the generation of the droop can be avoided. In addition, since the feedback loop is closed within the circuit of the laser driver 1, the drive current $I_0$ can be stably supplied to the laser Lm even when a potential of the ground GND on the laser Lm side (or a power source voltage VDD) is fluctuated. In addition, the feedback loop composes a feedback loop on the real time basis from the comparison result within a circuit different from the APC loop based on the external signal processing portion descried above. As a result, the comparison result can be controlled by using the feedback loop in accordance with a time constant which is much smaller than that in the APC loop.

1.5. Fourth Processing D

Next, the processing in the phase of end of the drive for the laser Lm as the fourth processing D will be described. The fourth processing D is continuously carried out at the time of end of the drive for the laser Lm in the third processing C described above.

In the fourth processing D, the feedback loop corresponding to the detection result obtained in the drive current detecting section 30 is not operated, and the control voltage Vct outputted from the control voltage generating section 50 is held constant. In addition, the switch Sw3 provided in the driving section 20 is held in an ON state. By carrying out such an operation, the second emitter follower 22 in the driving section 20 is voltage-driven, thereby discharging the electric charges accumulated in the parasitic capacitance Ca of the laser Lm. Specifically, the operation is carried out as follows.

The light emission controlling section 10 controls the control voltage generating section 50 in such a way that the comparing portion 51 stops the operation for comparing the magnitude of the drive current $I_0$ with the magnitude of the light emission reference current $I_0pr$, and the control voltage generating section 50 holds therein the voltage Vp as the comparison result right before stop of the operation in the form of a held voltage Vp'. The held voltage Vp' is used in the second processing B which will be carried out next time.

Moreover, the light emission controlling section 10 controls the control voltage generating section 50 in such a way that the comparing portion 51 outputs the held voltage Vb' to the amplifying portion 52. Also, the light emission controlling section 10 controls the switch Sw2 in the control voltage generating section 50 in such a way that the amplifying portion 52 amplifies the held voltage Vb' thus outputted. The held voltage Vb' amplified in the amplifying portion 52 is inputted in the form of the control voltage Vct1 to the input node of the first emitter follower 21 (the base of the first transistor Q1) in the driving section 20. The held voltage Vb' is a voltage corresponding to the result of the last comparison made (the result of the comparison between the bias current $I_0b$ and the bias reference current $I_0br$) by the comparing portion 51, and thus a given voltage held in the comparing portion 51.

When such a control voltage Vct1 is inputted to the base of the first transistor Q1 in the driving section 20, an emitter voltage of the first transistor Q1 becomes the bias voltage V1 as a given voltage corresponding to the control voltage Vct1 unless the electric charges are accumulated in the parasitic capacitance Ca of the laser Lm.

However, the electric charges are accumulated in the parasitic capacitance Ca of the laser Lm in accordance with the light emission voltage V2. For this reason, a base voltage of the first transistor Q1 in the driving section 20 becomes larger than the bias voltage V2, so that the operation of the first transistor Q1 is stopped. Therefore, the electric charges accumulated in the parasitic capacitance Ca of the laser Lm are discharged from the parasitic capacitance Ca merely in accordance with the time constant CaRact determined based on the parasitic capacitance Ca and the light emission resistance Ract. As a result, it may be difficult to realize the high-speed TF characteristics (in this case, a waveform similar to the waveform indicated by a dotted line in FIG. 7D is merely obtained).

In order to cope with such a situation, in the laser driver 1, the driving section 20 is provided with the second emitter follower 22 for the purpose of discharging the electric charges accumulated in the parasitic capacitance Ca at the time of end of the drive for the laser Lm.

Also, the switch Sw3 in the driving section 20 is turned ON by the light emission controlling section 10, thereby setting the second emitter follower 22 in the driving section 20 in the operating state. As a result, the laser Lm and the ground GND are connected to each other through the emitter follower 22, thereby discharging the electric charges accumulated in the parasitic capacitance Ca of the laser Lm.

That is to say, since the control voltage Vct1 is inputted to the base of the fourth transistor Q4 similarly to the case of the first transistor Q1, a collector voltage of the fourth transistor Q4 becomes equal to the bias voltage V1. Since upon turn-ON of the switch Sw3, the third transistor Q3 becomes the operating state, the second transistor Q2 composing the current mirror circuit becomes the operating state, and thus the emitter voltage of the second transistor Q2 becomes equal to the bias voltage V1. Since the bias voltage V1 is a given voltage, the second emitter follower 22 becomes the non-feedback type voltage drive. As a result, the electric charges accumulated in the parasitic capacitance Ca are discharged to the ground GND through the second transistor Q2 composing the second emitter follower 22. In such a manner, in the fourth processing D, the driving section 20 is made to function as the non-feedback type voltage drive not monitoring the drive current $I_0$ by stopping the base voltage controlling loop of the first emitter follower 21.

FIG. 2B shows a state of the control voltage Vct, the drive current $I_s$, and a current $I_R$ caused to flow through the light emission resistance Ract at this time. As shown in FIG. 2B, at a timing t3, the control voltage Vct1 as a given voltage is inputted to the base of the first transistor Q1. At this time, the second transistor Q2 is turned ON, thereby discharging the electric charges accumulated in the parasitic capacitance Ca of the laser Lm. In this case, since the second transistor Q2 operates as the emitter follower and an ON-resistance thereof is small, the electric charges accumulated in the parasitic capacitance Ca are quickly discharged.

It should be noted that when a ratio of a chip size of the first transistor Q1 to a chip size of the fourth transistor Q4 is m:1, the current which can be caused to flow through the second transistor Q2 is expressed by 1/m. However, since the second transistor Q2 operates as the emitter follower in a state in which the first transistor Q1 does not operate, the electric charges accumulated in the parasitic capacitance Ca are quickly discharged, thereby making it possible to improve the TF characteristics.

After that, at a timing t4 at which a predetermined time period Tf has passed, the processing in the light emission controlling section 10 returns back to the first processing A. That is to say, the light emission controlling section 10 controls the control voltage generating section 80 in such a way that the comparing portion 51 inputs the voltage Vb corresponding to the result of the comparison between the bias current Ib and the reference bias current Ibr to the amplifying portion 52. By carrying out such processing, the first emitter follower 21 supplies the bias current Ib to the laser Lm in accordance with the current drive.

As has been described, in the laser driver 1, the fourth processing D is carried out for the predetermined time period Tf (for the timings t3 to t4) at the time of end of the drive for the laser Lm, whereby the high-speed TF characteristics are realized without being influenced by the parasitic capacitance Ca and the like of the laser Lm.

2. Concrete Circuit Configuration of Laser Driver

Next, a concrete circuit configuration of a laser driver according to an example of the embodiment of the present invention will be described in detail with reference to FIGS. 3 to 5. It should be noted that the same constituent elements as those in FIG. 1 are designated by the same reference numerals, respectively.

Figure 3:
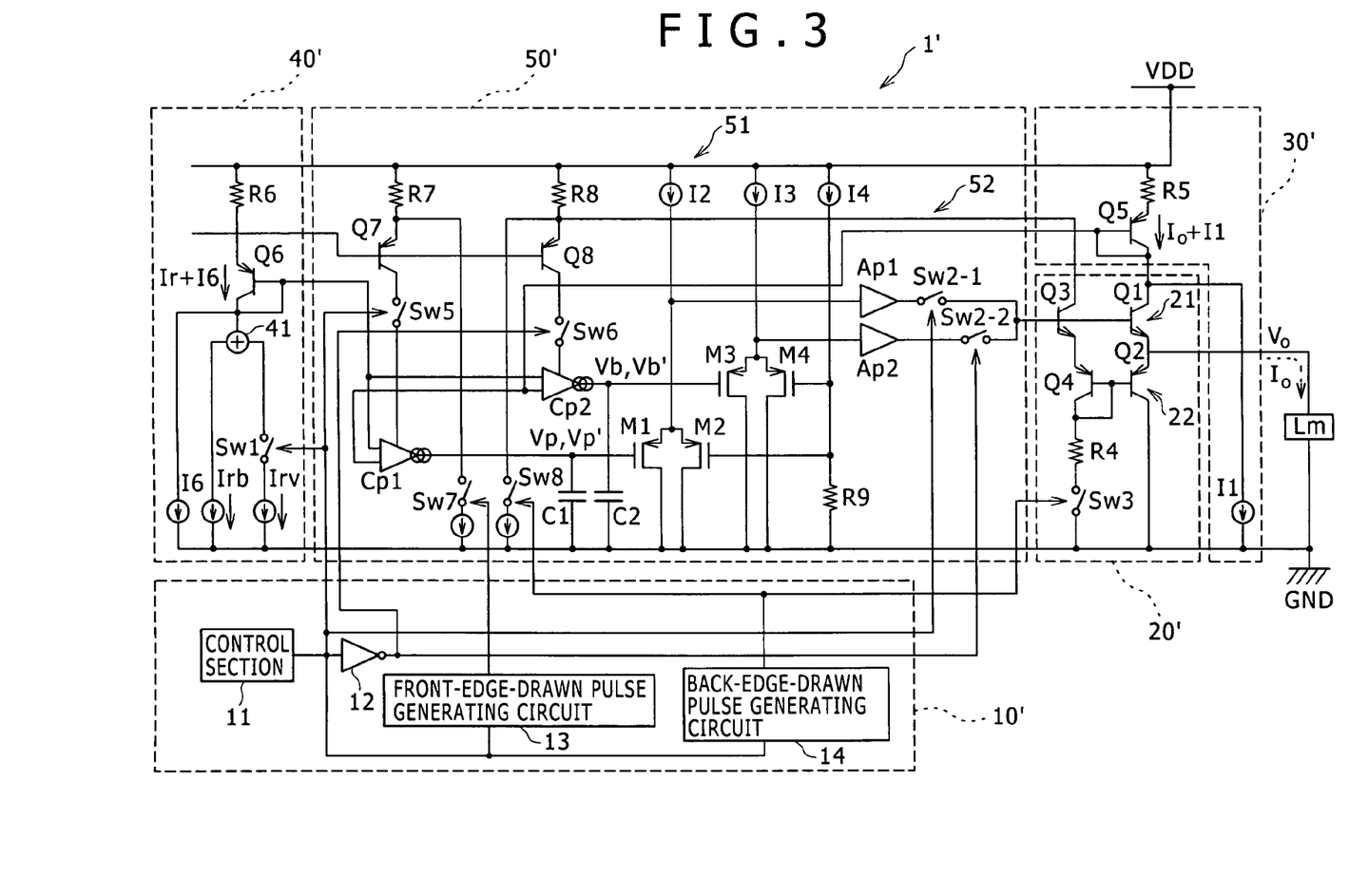
FIG. 3 is a circuit diagram showing a concrete circuit configuration of a laser driver according to an example of the embodiment of the present invention.

A laser driver 1' shown in FIG. 3 includes, as a concrete configuration, a light emission controlling section 10', a driving section 20', a drive current detecting section 30', a reference current detecting section 40', and a control voltage generating section 50' similarly to the case of the basic configuration of the laser driver 1 shown in FIG. 1. Hereinafter, a concrete configuration of the sectors 10' to 50' will be described in more detail.

2.1. Light Emission Controlling Section 10'

The light emission controlling section 10' includes a control section 11, an inverter circuit 12, a front-edge-drawn pulse generating circuit 13, a back-edge drawn pulse generating circuit 14.

The control section 11 outputs a data pulse DP as a control pulse. For a time period for which the data pulse DP is held at an H level, the light emission current $I_0p$ corresponding to the current value obtained by adding the bias reference current $I_0br$ to a control current Irv inputted thereto from the outside is supplied to the laser Lm. As a result, the laser Lm is caused to emit the laser beam at an intensity corresponding to the light emission current $I_0p$. In other words, the data pulse DP is a control pulse to switch the laser Lm between a light emission time period TL for which the laser Lm is caused to emit the laser beam, and a standby time period for which the laser Lm is held in a standby state for non-light emission.

The inverter circuit 12 outputs an inverted data signal xDP obtained by inverting a signal level of the data pulse DP.

The front-edge-drawn pulse generating circuit 13 starts to operate synchronously with the timing t1 of start of the time period TL for the light emission to generate a pulse having a width corresponding to the first time period Tr (hereinafter referred to as "a front-edge-drawn pulse EdgeF") in accordance with the data pulse DP.

The back-edge-drawn pulse generating circuit 14 starts to operate synchronously with the timing t3 of end of the time period TL for the light emission to generate a pulse having a width corresponding to the second time period Tf (hereinafter referred to as "a back-edge-drawn pulse EdgeB") in accordance with the data pulse DP.

The generation of the front-edge-drawn pulse EdgeF and the back-edge-drawn pulse EdgeB are carried out as follows by a front-edge-drawn pulse generating circuit 13 and a back-edge-drawn pulse generating circuit 14, respectively.

Figure 4A:
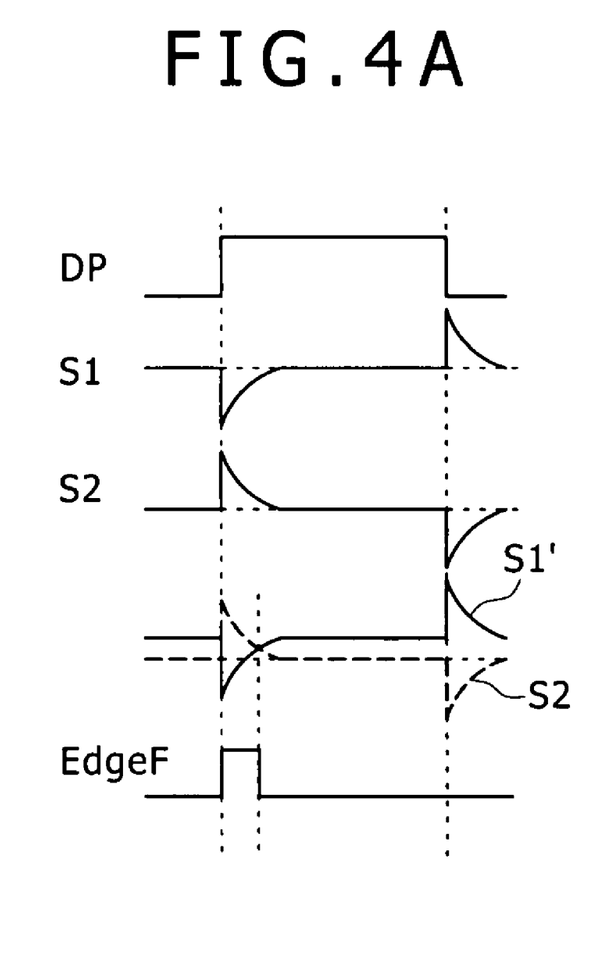
FIGS. 4A and 4B are respectively a waveform chart explaining a method of generating a front-edge-drawn pulse in the laser driver according to the embodiment of the present invention, and a waveform chart explaining a method of generating a back-edge-drawn pulse in the laser driver according to the embodiment of the present invention.

As shown in FIG. 4A, the front-edge-drawn pulse generating circuit 13 generates a first differential signal S1 created by differentiating the data pulse DP in a differentiating circuit, and a second differential signal S2 created by differentiating the inverted data pulse xDP. In addition, the front-edge-drawn pulse generating circuit 13 generates a shift signal S1' created by shifting a level of the first differential signal S1 to a positive side in a shift circuit. Also, the front-edge-drawn pulse generating circuit 13 generates the front-edge-drawn pulse EdgeF by comparing the shift signal S1' and the second differential signal S2 in a comparator.

Figure 4B:
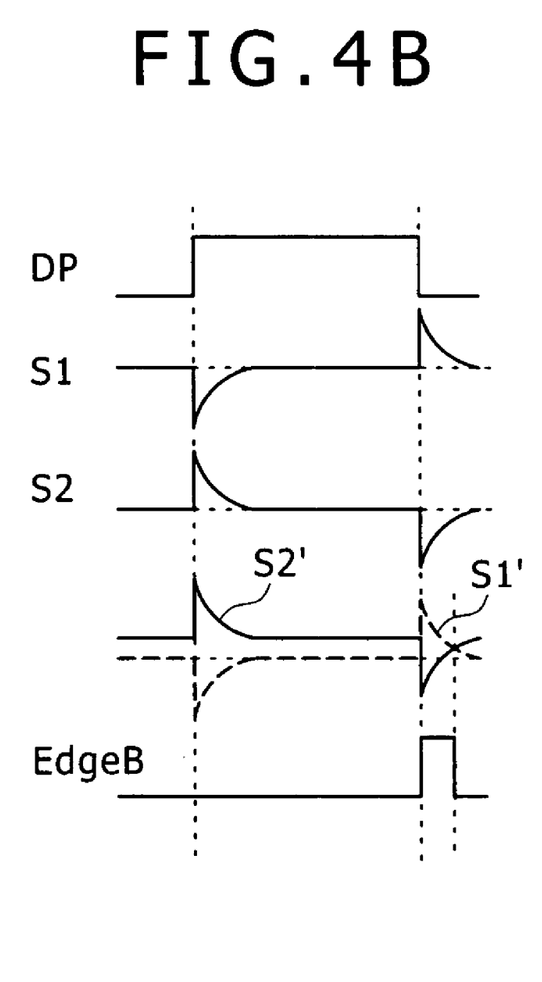

As shown in FIG. 4B, the back-edge-drawn pulse generating circuit 14 generates the first differential signal S1 by differentiating the data pulse DP in the differentiating circuit, and the second differential signal S2 by differentiating the inverted data pulse xDP. In addition, the back-edge-drawn pulse generating circuit 14 generates a shift signal S2' by shifting the level of the second differential signal S2 to the positive side in the shift circuit. Also, the back-edge-drawn pulse generating circuit 14 generates the back-edge-drawn pulse EdgeB by comparing the shift signal S2' and the first differential signal S1 in the comparator.

2.2. Driving Section 20'

The driving section 20', as previously stated, has the first to fourth transistors Q1 to Q4, and the switch Sw3. In addition, a resistor 4 is provided between the fourth transistor Q4 and the switch Sw3.

Also, the driving section 20' functions as the first emitter follower 21 for supplying the drive current $I_0$ to the laser Lm, also functions as the second emitter follower 22 for discharging the electric charges accumulated in the parasitic capacitance Ca of the laser Lm similarly to the case of the driving section 20 described above.

2.3. Drive Current Detecting Section 30'

The drive current detecting section 30' detects a voltage corresponding to the current value of the drive current $I_0$ as the magnitude of the drive current $I_0$ which the driving section 20' supplies to the laser Lm. Also, the drive current detecting section 30' inputs information on the voltage thus detected to the control voltage generating section 50'.

As shown in FIG. 3, the drive current detecting section 30' is configured by connecting a PNP type transistor Q5 diode-connected to a resistor R5 in series between the power source voltage VDD and the driving section 20' (the collector of the first transistor Q1). Specifically, one end of the resistor R5 is connected to the power source voltage VDD, and the other end of the resistor R5 is connected to an emitter of the fifth transistor Q5. In addition, a collector and a base of the fifth transistor Q5 are each connected to the collector of the first transistor Q1. Also, a current source I1 for supplying an idling current to the fifth transistor Q5 is provided between the collector of the fifth transistor Q5 and the ground GND.

When the drive current $I_O$ is caused to flow from the first emitter follower 21 in the driving section 20' to the laser Lm, a current having the same current value as that of the drive current $I_O$ is caused to flow through the resistor R5 as well and thus a voltage corresponding to the current value of the current is applied across opposite ends of the resistor R5. A voltage corresponding to a change in voltage developed across the opposite ends of the resistor R5 is developed at the base of the fifth transistor Q5, and is then outputted to the control voltage generating section 50'.

2.4. Reference Current Detecting Section 40'

The reference current detecting section 40' detects a voltage corresponding to the current value of the reference current Ir as the magnitude of the reference current Ir, and outputs information on the voltage thus detected to the control voltage generating section 50'.

In the reference current detecting section 40', as shown in FIG. 3, a resistor R6, a diode-connected PNP type transistor Q6, and a current source I6 are connected in series between the power source voltage VDD and the ground GND.

Specifically, one end of the resistor R6 is connected to the power source voltage VDD, and the other end of the resistor R6 is connected to an emitter of the sixth transistor Q6. In addition, a collector and a base of the sixth transistor Q6 are each connected to one end of the current source I6, and the other end of the current source I6 is connected to the ground GND.

Here, a ratio of a configuration size of the drive current detecting section 30' to a configuration size of the reference current detecting section 40' is set as n:1 (n>1), thereby reducing a mounting area of the reference current detecting section 40'. It is noted that "the configuration size" means a chip size of the fifth and sixth transistors Q5 and Q6, and the resistors R5 and R6. In addition, the current source I6 is a current source for causing the idling current to flow through the sixth transistor Q6, and also a current source having a current value which is (1/n) times as small as that of the current source I1.

An adder circuit 41 for adding the bias reference current $I_O$br and the control current Irv to each other is connected to the emitter of the sixth transistor Q6. The adder circuit 41 adds the control current Irv to the bias reference current $I_O$br, thereby generating a light emission reference current $I_O$pr. The reference current detecting section 40' is provided with the switch Sw1 through which the control current Irv is supplied to the adder circuit 41, whereby the bias reference current $I_O$br and the light emission reference current $I_O$pr are switched over to each other as the current which is caused to flow through the sixth transistor Q6. It should be noted that although the bias reference current $I_O$br and the control current Irv are inputted from an external signal processing portion (not shown) to the reference current detecting section 40', the bias reference current $I_O$br may be generated within the reference current detecting section 40'.

2.5. Control Voltage Generating Section 50'

The control voltage generating section 50' has the comparing portion 51, the amplifying portion 52, and switches Sw2-1 and Sw2-2.

The comparing portion 51 has a first comparator Cp1 and a second comparator Cp2. Here, each of the first comparator Cp1 and the second comparator Cp2 compares the voltage corresponding to the current value of the drive current $I_O$ detected by the drive current detecting section 30' with the voltage corresponding to the current value of the reference current Ir detected by the reference current detecting section 40'. In this case, the comparing portion 51 compares [(current value of drive current $I_O$)×(resistance value of resistor R5)+ (Vf of fifth transistor Q5)] with [(current value of drive current $I_O$)×(resistance value of resistor R6)+(Vf of sixth transistor Q6)]. However, such a configuration may not be necessarily adopted. For example, a configuration may also be adopted such that the fifth transistor Q5 and the sixth transistor Q6 compose a current mirror circuit, and a current proportional to a current caused to flow through the fifth transistor Q5 is caused to flow through the sixth transistor Q6 in order to carry out the comparison. In addition, the voltage developed across opposite ends of the resistor R5, and the voltage developed across opposite ends of the resistor R6 may be compared with each other without using the fifth and sixth transistors Q5 and Q6.

The first comparator Cp1 is a comparator for comparing the voltage corresponding to the current value of the drive current $I_O$ with the voltage corresponding to the current value of the light emission reference current $I_O$pr. The first comparator Cp1 operates by receiving an operation current through the resistor R7 and the PNP type transistor Q7 when the switch Sw5 is turned ON while the data pulse DP is held at an H level.

An output signal from the first comparator Cp1 is inputted to each of an amplifier Ap1 of the amplifying portion 52 through a differential amplifier composed of PMOS transistors M1 and M2, current sources I2 and I4, and a resistor R9.

A capacitor C1 for holding therein a voltage is connected to an output node of the first comparator Cp1. The capacitor C1 has a function of, when the comparing operation of the first comparator Cp1 is stopped, holding therein the output voltage Vp right before stop of the comparing operation as the held voltage Vp'. Since the MOS transistor (the PMOS transistor M1) is connected to the capacitor C1, the capacitor C1 can hold therein the held voltage Vp' until a next compensation time period with about several tens of pF.

The stop of the comparing operation by the first comparator Cp1 is carried out either when the switch Sw5 is turned OFF (when the data pulse DP is at the L level) or when the switch Sw7 is turned ON (when the front-edge drawn pulse EdgeF is at an H level). In the case other than those two cases, the comparing operation of the first comparator Cp1 is continuously carried out.

On the other hand, the second comparator Cp2 is a comparator for comparing the voltage corresponding to the current value of the drive current $I_O$ with the voltage corresponding to the current value of the bias reference current $I_O$br. The second comparator Cp2 operates by receiving an operation current through the resistor R8 and the transistor Q8 when the switch Sw6 is turned ON while the data pulse DP is held at the L level (while the inverted data pulse xDP is held at the H level).

An output signal from the second comparator Cp2 is inputted to an amplifier Apt of the amplifying portion 52 through a differential amplifier composed of PMOS transistors M3 and M4, the current sources I3 and I4, and the resistor R9.

A capacitor C2 for holding therein a voltage is connected to an output node of the second comparator Cp2. The capacitor C2 has a function of, when the comparing operation of the second comparator Cp2 is stopped, holding therein the output voltage V6 right before stop of the comparing operation as the held voltage Vb'. Since the MOS transistor (the PMOS transistor M3) is connected to the capacitor C2, the capacitor C2 can hold therein the held voltage Vb' until a next comparison time period with about several tens of pF.

The stop of the comparing operation by the second comparator Cp2 is carried out either when the switch Sw6 is turned OFF (while the inverted data pulse xDP is held at the L level) or when the switch Sw8 is turned ON (while the back-edge drawn pulse EdgeB is held at the H level). In the case other than those two cases, the comparing operation of the second comparator Cp2 is continuously carried out.

The amplifying portion 52 includes a first amplifier Ap1 and a second amplifier Ap2. The first amplifier Ap1 amplifies either the output voltage Vp or the held voltage Vp' in the first comparator Cp1. Also, the second amplifier Ap2 amplifies either the output voltage Vb or the held voltage Vb' in the second amplifier Cp2.

When the switch Sw2-1 is turned ON while the data pulse DP is held at the H level, the output voltage from the first amplifier Ap1 is outputted as the control voltage Vct2 to the driving section 20'. In addition, when the switch Sw2-2 is turned ON while the data pulse DP is held at the L level, the output voltage from the second amplifier Ap2 is outputted as the control voltage Vct1 to the driving section 20'.

Note that, the basic configuration of the laser driver 1 shown in FIG. 1 is different from that of the laser driver 1' shown in FIG. 3 in that the switch Sw2 is provided between the comparing portion 51 and the amplifying portion 52. However, any other suitable configuration may be adopted as long as the control voltage Vct1 corresponding to the output voltage Vb, and the control voltage Vct2 corresponding to the output voltage Vb can be selectively outputted.

In addition, although with the configuration shown in FIG. 3, the amplifiers and the switches (that is, the first amplifier Ap1 and the switch Sw2-1, and the second amplifier Ap2 and the switch Sw2-2), a high-speed Burton switch may also be used instead.

In the laser driver 1' configured in the manner described above, the driving section 20', the drive current detecting section 30', the reference current detecting section 40', and the control voltage generating section 50' are controlled in accordance with the pulses (the data pulse DP, the inverted data pulse xDP, the front-edge-drawn pulse EdgeF, and the back-edge-drawn pulse EdgeB) outputted, from the light emission controlling section 10'.

First Processing A: Up to Timing t1

Figure 5:
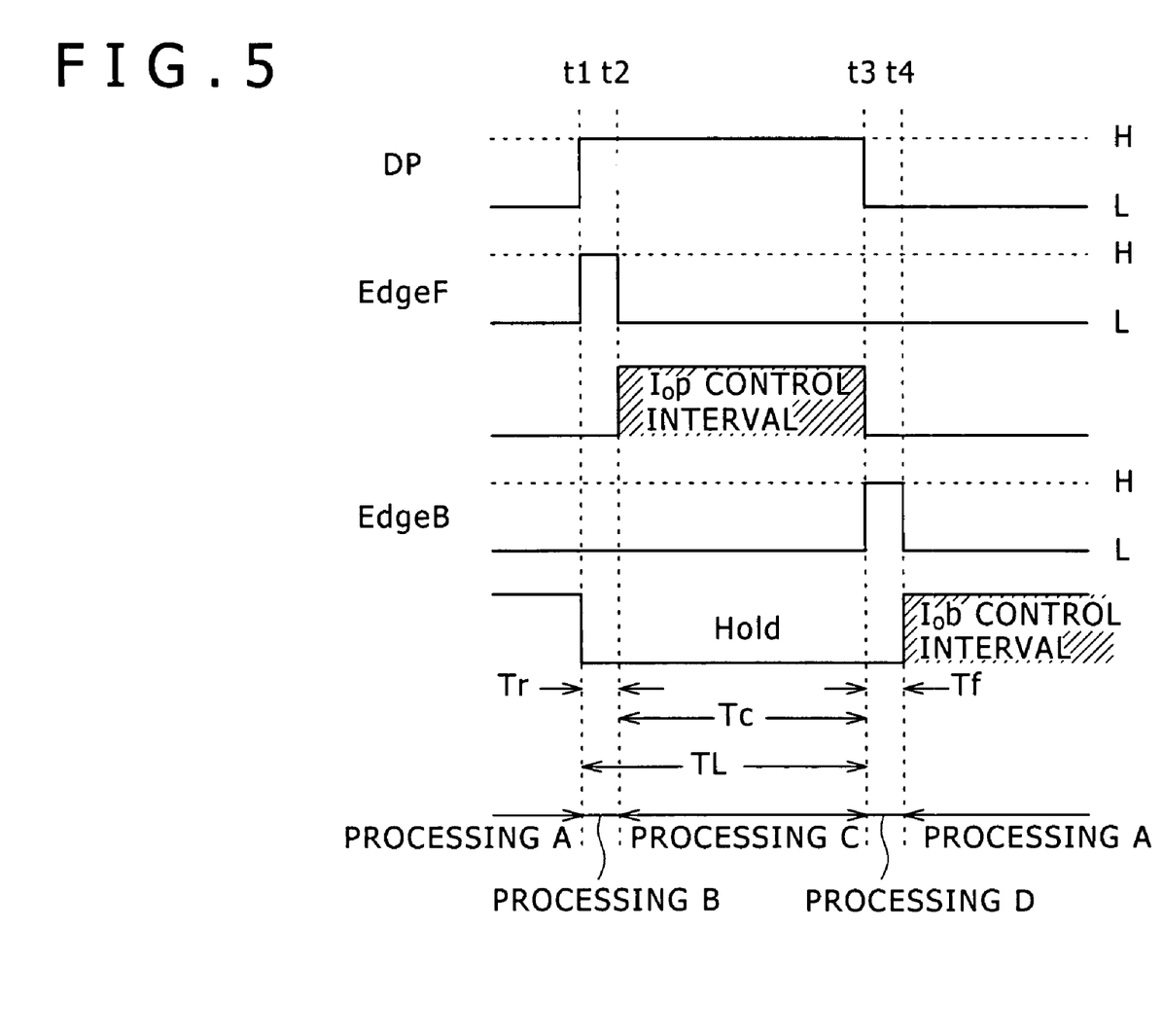
FIG. 5 is a timing chart explaining the operation of the laser driver according to the embodiment of the present invention.

As shown in FIG. 5, up to the timing t1 until the inverted data pulse xDP becomes the H level is an interval for which the laser Lm is driven in accordance with the bias current $I_0b$. For this interval, the first processing A is carried out.

The first processing A is carried out while the data pulse DP is held at the H level (the data pulse DP is held at the L level), and the back-edge-drawn pulse EdgeB is held at the L level.

While the inverted data pulse xDP is held at the H level, and the back-edge-drawn pulse EdgeB is held at the L level, the switch Sw6 is turned ON, and the switch Sw8 is turned OFF. As a result, the operation current is supplied to the second comparator Cp2.

For this reason, the voltage Vb corresponding to the result of the comparison between the voltage corresponding to the current value of the bias reference current $I_0br$ and the voltage corresponding to the current value of the drive current $I_0$ is outputted from the second comparator Cp2. Also, the voltage Vb is then inputted as the control voltage Vct1 to the driving section 20' through the second amplifier Ap2 and the switch SW2-2.

The driving section 20' functions as the feedback type current drive in accordance with the control voltage Vct1 outputted through the switch SW2-2, and supplies the bias current $I_0b$ from the first emitter follower 21 to the laser Lm.

That is to say, the laser driver 1' forms the feedback loop for monitoring the bias current $I_0b$ in real time, comparing the bias current $I_0b$ thus monitored with the bias reference current $I_0br$ detected by the reference current detecting section 40', and feeding the comparison result as the control voltage Vct1 back to the driving section 20' for carrying out the voltage drive in the first processing A. To this end, the first emitter follower 21 in the driving section 20' is controlled in accordance with the control voltage Vct1 inputted to the driving section 20' so that the voltage corresponding to the current value of the drive current $I_0$, and the voltage corresponding to the current value of the reference current Ir become equal to each other. As a result, the bias current $I_0b$ corresponding to the current value of the bias reference current $I_0br$ is stably supplied from the first emitter follower 21 in the driving section 20' to the laser Lm.

It is noted that since for the time period for the first processing A, the data pulse DP is held at the L level and the back-edge-drawn pulse EdgeB is also held at the L level, no operation current is supplied to the first comparator Cp1, and thus the comparing operation of the first comparator Cp1 is stopped. In addition, at this time, the capacitor C1 holds therein the output voltage Vp from the first comparator Cp1 as the held voltage Vp' right before stop of the comparing operation of the first comparator Cp1. At this time, the voltage corresponding to the held voltage Vp' is applied to the first amplifier Ap1 through the differential amplifier.

Second Processing B: Timings t1 to t2

After that, the front-edge-drawn pulse EdgeF is changed from the L level to the H level at the timing t1 at which the data pulse DP becomes the H level.

When the data pulse DP becomes the H level, the switch Sw5 is turned ON, so that the operation current is attempted to be supplied to the first comparator Cp1. However, the front-edge-drawn pulse EdgeF becomes the H level to turn ON the switch Sw7. For this reason, no operation current is supplied to the first comparator Cp1, so that the comparing operation of the first comparator Cp1 is stopped. As a result, the voltage inputted to the first amplifier Ap1 continuously becomes the voltage corresponding to the held voltage Vp'.

In addition, since the data pulse DP becomes the H level, the switch Sw2-1 is turned OFF, while the switch Sw1 is turned ON. To this end, the control voltage Vct2 corresponding to the held voltage Vp' as the given voltage is outputted from the control voltage generating section 50' to the driving section 20' (the base of the first transistor Q1).

As a result, the light emission voltage V2 is applied as the drive voltage $V_0$ to the laser Lm, so that the laser Lm is voltage-driven. For this reason, the parasitic capacitance Ca of the laser Lm is quickly charged with the electric charges, and also the light emission current $I_0p$ necessary for emitting the laser beam having the predetermined intensity is supplied to the light emission resistance Ract of the laser Lm from the time of start of the supply.

It is noted that since the inverted data pulse xDP is held at the L level for the time period for the second processing B, no operation current is supplied to the second comparator Cp2, and thus the comparing operation of the second comparator Cp2 is stopped. In addition, at this time, the output voltage Vb from the second comparator Cp2 is held as the held voltage Vb' in the second comparator Cp2 right before stop of the comparing operation of the second comparator Cp2. At this time, the voltage corresponding to the held voltage Vb' is applied to the second amplifier Ap2 through the differential amplifier.

Third Processing C: Timings t2 to t3

After that, the front-edge-drawn pulse EdgeF is changed from the H level to the L level at the timing t2 after a lapse of the first time period Tr from the timing t1. For this reason, the switch Sw7 is turned ON, so that the operation current is caused to flow through the first comparator Cp1. As a result, the first comparator Cp1 outputs the voltage Vp corresponding to the result of the comparison between the voltage corresponding to the current value of the drive current $I_0$ and the voltage corresponding to the current value of the light emission reference current $I_0$pr.

At this time, since the data pulse DP is held at the H level, and thus the switch Sw2-1 is continuously held in the ON state, the output voltage Vp from the first comparator Cp1 is inputted as the control voltage Vct2 to the driving section 20' through the first amplifier Ap1 and the switch Sw2-1.

The first emitter follower 21 in the driving section 20' is controlled in accordance with the control voltage Vct2 inputted to the driving section 20' so that the voltage corresponding to the current value of the drive current $I_0$, and the voltage corresponding to the current value of the light emission reference current $I_0$pr become equal to each other. As a result, the light emission current $I_0$p corresponding to the current value of the light emission reference current $I_0$pr is stably supplied from the emitter follower 21 to the laser Lm. That is to say, the driving section 20' functions as the feedback type current drive.

Note that, since the inverted data pulse xDP is held at the L level for the time period as well for the third processing C, no operation current is supplied to the second comparator Cp2. As a result, the voltage corresponding to the held voltage Vb' is applied to the second amplifier Ap2 through the differential amplifier similarly to the case of the time period for the second processing B.

Fourth Processing D: Timings t3 to t4

After that, at the timing t3 at which the data pulse DP is changed from the H level to the L level, the inverted data pulse xDP is changed from the L level to the H level, and also the back-edge-drawn pulse EdgeB is changed from the L level to the H level.

When the inverted data pulse xDP is changed from the L level to the H level, the switch Sw6 is turned ON, and the operation current is attempted to be supplied to the second comparator Cp2. However, since the back-edge-drawn pulse EdgeB becomes the H level to turn ON the switch Sw8, no operation is caused to flow through the second comparator Cp2, and thus the comparing operation of the second comparator Cp2 is held stopped. Therefore, the capacitor C2 maintains the state of holding the held voltage Vb' as the voltage corresponding to the result if the last comparison made by the second comparator Cp2.

Since the switch Sw2-2 is turned ON when the inverted data pulse xDP becomes the H level, the held voltage Vb' held in the capacitor C2 is outputted as the control voltage Vct1 as the given voltage to the driving section 20' through the second amplifier Ap2 and the switch Sw2-2. It is noted that since the data pulse DP becomes the L level at this time, the switch Sw2-1 is turned OFF.

Moreover, when the inverted data pulse xDP becomes the H level, the switch Sw3 is turned ON, so that the third transistor Q3 becomes the opening state. For this reason, as described above, the second transistor Q2 functions as the second emitter follower 22, so that the laser Lm and the ground GND are connected to each other through the second transistor Q2, and thus the electric charges accumulated in the parasitic capacitor Ca are quickly discharged.

Although the embodiment and the example thereof have been described so far with reference to the accompanying drawings, the embodiment and the example thereof are merely exemplified, and thus the present invention can be embodied in the form in which various changes and improvements are made based on the knowledge of those skilled in the art.

For example, the voltage corresponding to the difference between the magnitude of the drive current $I_0$ and the magnitude of the reference current Ir is held as the held voltage Vb', Vp' in the comparing portion 51, and such a voltage is outputted to the driving section 20, 20' through the amplifier. However, all it takes is that the given voltage corresponding to the magnitude of the reference current Ir can be outputted to the driving section 20, 20'. For example, the voltage corresponding to the magnitude of the reference current Ir may be generated without comparison with the magnitude of the drive current $I_0$, and may be outputted as the control voltage to the driving section 20, 20'.

It is noted that when the voltage corresponding to the difference between the magnitude of the drive current $I_0$ and the magnitude of the reference current Ir is held, for example, that voltage may also be held after the difference between the magnitude of the drive current $I_0$ and the magnitude of the reference current Ir is amplified in the amplifier. That is to say, all it takes is that the control voltage Vct corresponding to the difference between the magnitude of the drive current $I_0$ and the magnitude of the reference current Ir can be held in terms of results.

In addition, a given voltage corresponding to the magnitude of the reference current Ir may be used as the control voltage Vct instead of using the control voltage Vct corresponding to the difference between the magnitude of the drive current $I_0$ and the magnitude of the reference current Ir.

As described above, the laser driver 1, 1' of the embodiment or the example thereof includes: the driving section 20, 20'; the drive current detecting section 30, 30'; the reference current detecting section 40, 40'; the control voltage generating section 50, 50'; and the light emission controlling section 10, 10'. In this case, the driving section 20, 20' has the first emitter follower 21 for supplying the drive current $I_0$ to the laser Lm, and the second emitter follower 22 for discharging the electric charges accumulated in the laser Lm. The drive current detecting section 30, 30' detects the magnitude of the drive current $I_0$. The reference current detecting section 40, 40' receives as its input the reference current Ir as the reference for the drive current $I_0$, and detects the magnitude of the reference current Ir. In addition, the control voltage generating section 50, 50' compares the detection result obtained in the drive current driving section 30, 30' with the detection result obtained in the reference current detecting section 40, 40', and generates the control voltage Vct corresponding to the comparison result. Also, the light emission controlling section 10, 10' stops the processing for generating the control voltage Vct by the control voltage generating section 50, 50', and outputs the given voltage corresponding to the magnitude of the reference current Ir to the input node of the first emitter follower 21 to operate the first emitter follower 21 for the first time period Tr from start of light emitting period TL for the laser Lm. (The control voltage generating section 50, 50' stops generating the control voltage Vct corresponding to the comparison result (the voltage corresponding to the voltage Vp, Vb) to holds the therein the control voltage Vct. The given voltage, for example, is the control voltage Vct thus held at this time (the voltage corresponding to the held voltage Vp', Vb').) The light emission controlling section 10, 10' releases the stop of the generation of the control voltage Vct by the control voltage generating section 50, 50', and outputs the control voltage Vct thus generated (the voltage corresponding to the voltage Vp, Vb) to the input node of the first emitter follower 21 to operate the first emitter follower 21 until the end of the subsequent light emission time period TL for the laser Lm. Also, the light emission controlling section 10, 10' causes the emitter follower 22 to operate so as to discharge the electric charges accumulated in the laser Lm for the second time period Tf after end of the light emission time period TL for the laser Lm.

Therefore, the drive current is supplied to the laser Lm through the voltage drive for the first time period Tr from the start of the light emission time period TL for the laser Lm. As a result, the high-speed rising characteristics (TR characteristics) can be realized without being influenced by the parasitic capacitance Ca parasitic in the laser Lm.

In addition, after that, the feedback loop for monitoring the drive current $I_0$ in real time during the voltage drive, and feeding the drive current $I_0$ thus monitored back to the drive voltage operates until the end of the light emission time period. TL for the laser Lm. As a result, the drive current $I_0$ can be held constant irrespective of the change in light emission resistance Ract of the laser Lm. Since the feedback loop is closed within the circuit in the laser driver 1, the drive current $I_0$ can be stably supplied to the laser Lm even when the potential of the ground GND on the laser Lm side (or the power supply voltage VDD) is changed.

Moreover, the second emitter follower 22 can be caused to operate to discharge the electric charges accumulated in the parasitic capacitance Ca of the laser Lm for the second time period Tf after the end of the light emission time period TL for the laser Lm. As a result, the electric charge drawing characteristics are enhanced, and thus it is possible to realize the high-speed fall characteristics (TF characteristics).

In addition thereto, since the voltage driving system having the simple emitter follower is used as the basic system, the complicated timing control needs not to be carried out, and no correction current is applied. As a result, no correction shift is caused, and thus the circuit can be very simply configured with a small scale.

The present application contains subject matter related to that disclosed in Japanese Priority Patent Application JP 2009-097356 filed in the Japan Patent Office on Apr. 13, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A laser driver, comprising:
    driving means having
        a first emitter follower for supplying a drive current to a laser, and
        a second emitter follower for discharging electric charges accumulated in the laser;
    drive current detecting means for detecting a magnitude of the drive current;
    reference current detecting means for receiving as its input a reference current as a reference for the drive current, and detecting a magnitude of the reference current;
    control voltage generating means for comparing a detection result obtained in said drive current detecting means and a detection result obtained in said reference current detecting means with each other, and generating a control voltage corresponding to the comparison result; and
    light emission controlling means for stopping the generation of the control voltage by said control voltage generating means and causing a given voltage corresponding to the magnitude of the reference current to be outputted to an input node of said first emitter follower to operate said first emitter follower for a first time period from start of a light emission time period of said laser, releasing the stop of the generation of the control voltage by said control voltage generating means and causing the control voltage thus generated to be outputted to said input node of said first emitter follower to operate said first emitter follower until end of the light emission time period of said laser, and operating said second emitter follower to discharge electric charges accumulated in said laser for a second time period after the end of the light emission time period of said laser.

2. The laser driver according to claim 1, wherein said light emission controlling means
    inputs a control pulse for switching the light emission time period for which said laser is caused to emit a laser beam, and a standby time period for which said laser is set in a standby state for non-light emission;
    generates a front-edge-drawn pulse having a length corresponding to the first time period and starting synchronously with a start timing for the light emission time period in accordance with the control pulse, and outputs the front-edge-drawn pulse to said control voltage generating means, thereby stopping the generation of the control voltage made by said control voltage generating means; and
    generates a back-edge-drawn pulse having a length corresponding to the second time period and starting synchronously with an end timing for the light emission time period in accordance with the control pulse, and outputs the back-edge-drawn pulse to each of said control voltage generating means and said driving means, thereby stopping the generation of the control voltage, and operating said second emitter follower in accordance with the back-edge-drawn pulse.

3. The laser driver according to claim 1, wherein said first emitter follower is composed of a first transistor, said second emitter is composed of a second transistor, and emitters of said first transistor and said second transistor are connected to each other;
    said driving means further comprises:
    a third transistor composing a current mirror circuit together with said second transistor; and
    a fourth transistor having an emitter connected to an emitter of said third transistor, and receiving as its input the control voltage at its base; and
    said light emission controlling means operates said third transistor for the second time period after end of the light emission time period for said laser to operate said second transistor, thereby discharging the electric charges accumulated in said laser.

4. The laser driver according to claim 3, wherein each of said drive current detecting means and said reference current detecting means is configured by connecting a diode-connected transistor and a resistor to each other; and
    a size of said drive current detecting means, and a size of said reference current detecting means are set so as to meet a relationship of a ratio of n:1 (n>1).

5. The laser driver according to claim 1, wherein the drive current includes
    a light emission current with which said laser is caused to emit a laser beam, and a bias current with which said laser is set in a standby state for non-light emission;

said reference current detecting means detects a magnitude of a reference light emission current as a reference for the light emission current, and a magnitude of a reference bias current as a reference for the bias;

said control voltage generating means comprises:

a first comparator for comparing a magnitude of the light emission current detected in said drive current detecting means, and a magnitude of the reference light emission current detected in said reference current detecting means with each other, and outputting a voltage corresponding to the comparison result;

a second comparator for comparing a magnitude of the bias current and a magnitude of the reference bias current with each other, and outputting a voltage corresponding to the comparison result;

a first amplifier for amplifying an output voltage from said first capacitor, and generating and outputting the control voltage; and a second amplifier for amplifying an output voltage from said second capacitor, and generating and outputting the control voltage; and said light emission controlling means causes said first amplifier to output the control voltage for the light emission time period for which said laser is caused to emit a laser beam, and causes said second amplifier to output the control voltage for a standby time period for which said laser is set in a standby state for non-light emission.

6. A laser driver, comprising:

a driving section having
- a first emitter follower for supplying a drive current to a laser, and
- a second emitter follower for discharging electric charges accumulated in the laser;

a drive current detecting section configured to detect a magnitude of the drive current;

a reference current detecting section configured to receive as its input a reference current as a reference for the drive current, and detect a magnitude of the reference current;

a control voltage generating section configured to compare a detection result obtained in said drive current detecting section and a detection result obtained in said reference current detecting section with each other, and generate a control voltage corresponding to the comparison result; and a light emission controlling section configured to stop the generation of the control voltage by said control voltage generating section, causing a given voltage corresponding to the magnitude of the reference current to be outputted to an input node of said first emitter follower to operate said first emitter follower for a first time period from start of a light emission time period of said laser, release the stop of the generation of the control voltage by said control voltage generating section, causing the control voltage thus generated to be outputted to said input node of said first emitter follower to operate said first emitter follower until end of the light emission time period of said laser, and operate said second emitter follower to discharge electric charges accumulated in said laser for a second time period after the end of the light emission time period of said laser.

* * * * *